(12) United States Patent
Montanari et al.

(10) Patent No.: US 8,527,221 B2
(45) Date of Patent: Sep. 3, 2013

(54) METHOD AND AN APPARATUS FOR MONITORING AN ACTIVITY OF PARTIAL ELECTRICAL DISCHARGES IN AN ELECTRICAL APPARATUS POWERED WITH DIRECT VOLTAGE

(75) Inventors: Gian Carlo Montanari, Casalecchio di Reno (IT); Andrea Cavallini, San Pietro in Casale (IT); Gaetano Pasini, Marano sul Panaro (IT)

(73) Assignee: Techimp Technologies S.r.l., Bologna (IT)

( * ) Notice: Subject to any disclaimer, the term of this patent is extended or adjusted under 35 U.S.C. 154(b) by 410 days.

(21) Appl. No.: 12/670,081

(22) PCT Filed: Jan. 29, 2008

(86) PCT No.: PCT/IB2008/050312
§ 371 (c)(1),
(2), (4) Date: Mar. 23, 2010

(87) PCT Pub. No.: WO2009/013638
PCT Pub. Date: Jan. 29, 2009

(65) Prior Publication Data
US 2010/0191486 A1    Jul. 29, 2010

(30) Foreign Application Priority Data
Jul. 26, 2007 (IT) .............................. PR2007A0058

(51) Int. Cl.
| | | |
|---|---|---|
| *G01R 31/00* | (2006.01) |
| *A41F 1/00* | (2006.01) |
| *A41F 1/08* | (2006.01) |
| *A44B 1/04* | (2006.01) |
| *A44B 11/25* | (2006.01) |
| *A44B 17/00* | (2006.01) |
| *B42F 1/00* | (2006.01) |
| *B42F 1/02* | (2006.01) |

(52) U.S. Cl.
USPC ................ 702/58; 702/59; 324/522; 324/536

(58) Field of Classification Search
USPC ...................................... 702/58, 59; 324/522
See application file for complete search history.

(56) References Cited

U.S. PATENT DOCUMENTS
2003/0140701 A1*  7/2003  O'Brien et al. ................. 73/596

OTHER PUBLICATIONS

Cavallini, A., et al., "A New Approach to the Diagnosis of Solid Insulation Systems Based on PD Signal Inference", IEEE Electrical Insulation Magazine, IEEE Service Center, New York, NY, vol. 19, No. 2, Mar. 1, 2003, pp. 23-30.

(Continued)

*Primary Examiner* — Alexander H Taningco
*Assistant Examiner* — Manuel Rivera Vargas
(74) *Attorney, Agent, or Firm* — Pearne & Gordon LLP

(57) ABSTRACT

A method for monitoring an activity of partial electrical discharges in an electric apparatus powered with direct voltage comprises the following steps, repeated in succession at predetermined time intervals: measuring (1) analogue electrical signals and generating corresponding digital signals representative of the wave form of partial discharge impulses; deriving (2) for each of said digital signals, at least one shape parameter and at least one amplitude parameter; separating (3) the set of the measured data into homogeneous sub-sets with respect to the shape parameter; correlating (4) the sub-sets of signals having similar values of the shape parameter and measured in successive steps; selecting (5) the correlated sub-sets for which the amplitude parameter has a predetermined profile over time and attributing the signals of said sub ⌐ sets to partial discharge activities. The methods currently in use do not allow to monitor partial discharge activities in an apparatus in DC, because they do not allow to distinguish the signals relating to the partial discharges from those relating to noise or to disturbances.

5 Claims, 1 Drawing Sheet

(56) References Cited

OTHER PUBLICATIONS

Morshuis, Peter, et al., "Partial Discharge Part XXIV: The Analysis of PD in HVDC Equipment", IEEE Electrical Insulation Magazine, IEEE Service Center, New York, NY, vol. 13, No. 2, Mar. 1, 1997, pp. 6-16.

Maqrashi, A., "Pattern Recognition of Partial Discharges Using Matlab Tools", Universities Power Engineering Conference, 2004, UPEC 2004, 39th International Bristol, UK, Sep. 6-8, 2004, Piscataway, NJ, IEEE, vol. 1, Sep. 6, 2004, pp. 197-201.

Cavallini, A., et al., "Experience of Testing Polymeric HV Cable Systems by an Innovative Partial Discharge Measurement Approach", Power System Technology, 2004, Powercon 2004, 2004 International Conference on Singapore, Nov. 21-24, 2004, Piscataway, NJ, IEEE, vol. 2, Nov. 21, 2004, pp. 1684-1688.

* cited by examiner

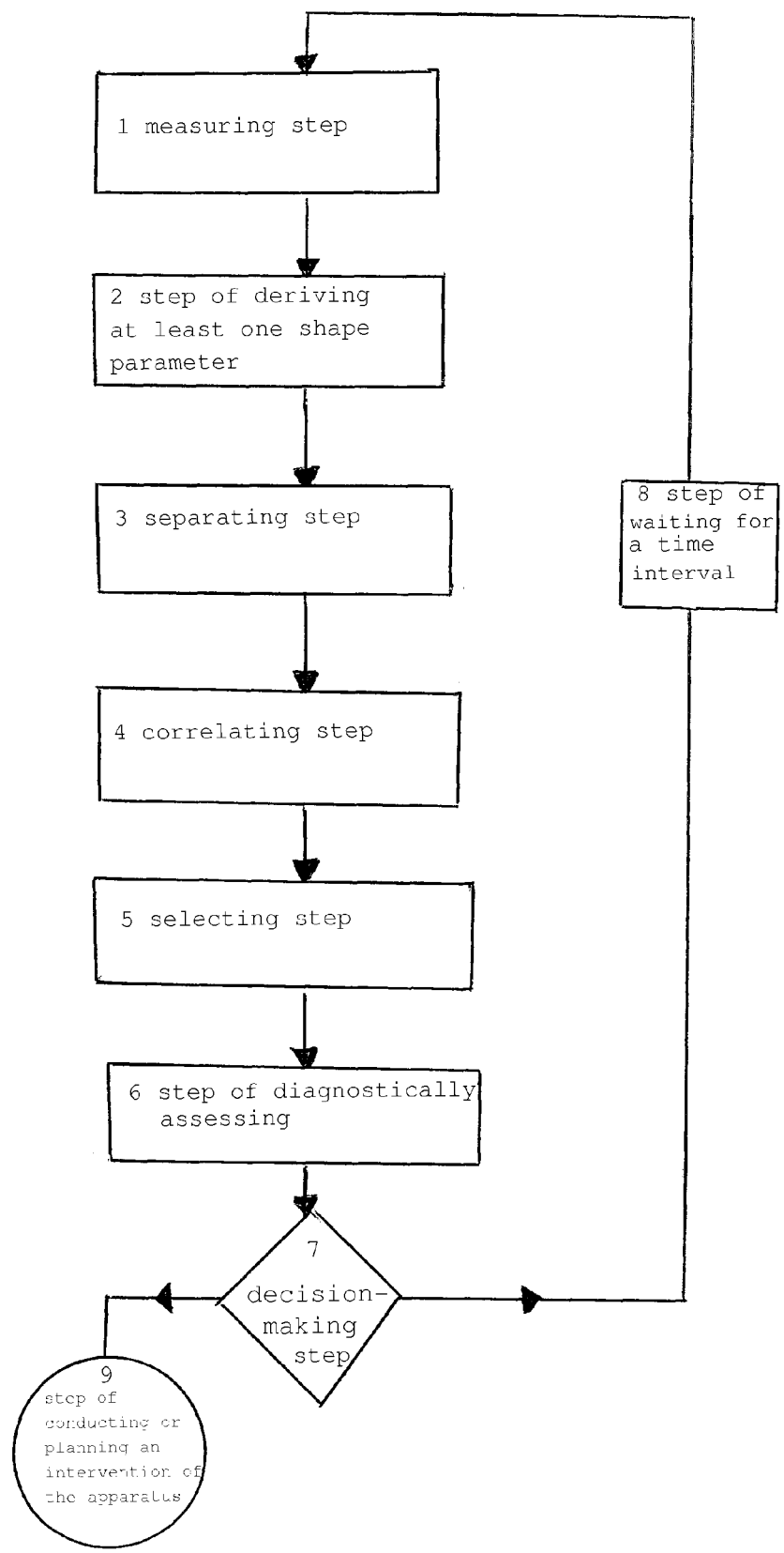

METHOD AND AN APPARATUS FOR MONITORING AN ACTIVITY OF PARTIAL ELECTRICAL DISCHARGES IN AN ELECTRICAL APPARATUS POWERED WITH DIRECT VOLTAGE

TECHNICAL FIELD AND BACKGROUND ART

The present invention relates to a method and an apparatus for monitoring an activity of partial electrical discharges in an electrical apparatus powered with direct voltage.

More in general, the technical field of the present invention is that of the diagnostics of electrical systems (in particular high voltage systems), by measuring/processing partial electrical discharges.

It should be noted that a partial discharge is an electrical discharge that involves a limited portion of an insulator of an electrical system, therefore it does not cause the immediate failure of the system, but its progressive degradation. Thus, partial discharges have, by their nature, a development that is substantially limited to a defect of the insulating system.

In this light, diagnostic techniques based on the measurement and interpretation of partial discharges are among the most promising ones and they are widely studied within scientific research, because the assessment of signals relating to partial discharges enables to investigate the nature of the defects of the insulating system in which the discharges take place and the position of the defects within the insulating system. In this light, it should be noted that measuring and monitoring partial discharges is a consolidated practice with regard to electrical apparatuses subjected to alternating voltage (AC). In fact, partial discharge phenomena in AC have also long been the subject of scientific studies. On the contrary, partial discharge phenomena in the presence of direct voltage (DC) are almost neglected both in the literature and in the current practice of diagnostic activities. In fact, since it is not possible in DC to establish a time correlation between discharge events and profile of the power supply voltage (and hence of the electrical field that generates them), it is extremely complex to separate the discharge phenomenon from the noise and from other disturbance phenomena. Moreover, it should be noted that the correlation between discharge events and phase of the electrical field that generates the discharges is a central element also in systems for interpreting the acquired discharge phenomena, i.e. for associating a discharge activity to a defect of an insulating system to be assessed. Identification is a fundamental step to correctly define the reliability of the component studied, because the different types of defects often produce degradation effects that are highly different from each other.

However, electrical apparatuses subjected to direct voltage are not at all free from partial discharge phenomena, although in DC insulating systems the repetition rate of the discharges is typically lower than in AC insulating systems.

Therefore, if it were possible to separate the noise and the disturbances from the partial discharge phenomena and to distinguish the different types of phenomena present in an apparatus, being able to measure and monitor the activity of partial discharges also in electric apparatus operating in DC, that would be a useful diagnostic tool.

In this regard, diagnostic techniques in use provide for conducting measurements of partial discharges on DC operating electric apparatus subjecting said apparatuses to an alternating voltage (i.e. conducting the measurements of partial discharges in AC), to have available a correlation of the discharges with the phase of the voltage.

For this purpose, methods for measuring partial discharges are known which provide for powering the apparatuses (e.g. electrical cables) with an alternating voltage at 0.1 Hz or with resonating systems.

However, the results obtained with said methods have little reliability, because the electrical conditions created specifically during the measurements by applying an alternating voltage do not match the actual conditions of operation. For example, since the profile of the electric field in a DC powered cable is completely different from the same cable powered in AC, it is possible that during the measurements conducted with said methods (in AC), discharge phenomena may occur that in operating conditions (in DC) would not have developed; or, alternating voltage may highlight as particularly significant a discharge phenomen that is relatively harmless in operating conditions, neglecting instead other discharge phenomena that instead, in operating conditions, are particularly dangerous.

DISCLOSURE OF INVENTION

The object of the present invention is to eliminate the aforesaid drawbacks and to make available a method for measuring and processing partial electrical discharges in an electric apparatus subjected to a direct voltage, that is particularly effective, providing reliable information for a diagnostic assessment.

Said object is fully achieved by the method of the present invention, which is characterised by the content of the appended claims and in particular in that it comprises the following steps, repeated in succession at predetermined time intervals:

- measuring analogue electrical signals detected by a sensor operatively coupled to the apparatus and generating corresponding digital signals representative of the wave forms of said analogue signals;
- deriving, for each of said digital signals, at least one shape parameter correlated to the wave form of that signal and at least one amplitude parameter correlated to the amplitude of that signal;
- separating the set of said measured digital signals into sub-sets, so that the digital signals of each sub-set have similar values of the shape parameter;
- correlating the sub-sets of signals having similar values of the shape parameter and measured in successive steps at said predetermined time intervals, defining correlated groups of sub-sets;
- selecting any correlated groups of sub-sets for which the amplitude parameter has a predetermined profile over time and attributing the signals of said sub-sets to partial discharge activities.

BRIEF DESCRIPTION OF DRAWINGS

These and other characteristics shall become more readily apparent from the following description of a preferred embodiment, illustrated purely by way of non limiting example in the accompanying drawing table, in which the sole FIGURE schematically shows the method according to the present invention.

The method according to the present invention relates to a method for monitoring an activity of partial electrical discharges in an electrical apparatus powered with direct voltage (DC).

The expression "monitoring an activity of partial discharges in an apparatus" means the measurement of electrical signals (current impulses) associated to partial discharges repeated periodically in successive steps, in order to take under control the defects of the electric apparatus in which the partial discharges take place and thereby to be able to plan maintenance interventions deciding, case by case, whether to intervene on the apparatus or continue with the monitoring, depending on the dangerousness attributed to the activities of partial discharges, or to the defects observed.

It should be noted that this method provides for coupling to the apparatus to be assessed one or more sensors able to detect the current impulses relating to the partial discharges taking place in the apparatus itself, according to the prior art (said sensors are substantially of the same types used to measure partial discharges in AC).

Therefore, the present method comprises a sequence of acquisitions repeated over time of the electrical signals detected by the sensor, with the possibility to carry out, based on the results of the acquisitions, a diagnostic assessment of the apparatus.

Note that it is inevitable that also various signals relating to disturbances or to background noise, or otherwise not related to the partial discharge activities taking place in the apparatus will couple with the sensor; such signals are not the signals that one desires to monitor and assess from the diagnostic viewpoint, but they are undesired signals that are often superposed to the signals to be monitored.

In this light, the method of the present invention originally comprises the following steps, periodically repeated in succession, i.e. at predetermined time intervals.

BEST MODE FOR CARRYING OUT THE INVENTION

A first step (designated with the reference number 1 in the FIGURE) is a step of measuring analogue electrical signals detected by the sensor and subsequently generating corresponding digital signals representative of the wave form of the analogue signals detected.

This step may be preceded by an analogue filtering step or followed by a digital filtering step, if it is necessary to boost the signal/noise ratio.

A second step (designated with the number 2 in the FIGURE) is a step of deriving, for each of said digital signals detected, at least one shape parameter correlated to the wave form of the signal and at least one amplitude parameter correlated to the amplitude of the same signal.

In particular, preferably a first shape parameter (T) is measured, correlated to the time duration of the signal, and a second shape parameter (W) is measured, correlated to the frequency content of the signal, i.e. the equivalent bandwidth of the signal.

To calculate said first and second shape parameter, preferably the following formulas are used.

$$T = \frac{\int (t-t_0)^2 x(t)^2 dt}{\int x(t)^2 dt}$$

$$W = \frac{\int \omega^2 X(\omega)^2 d\omega}{\int X(\omega)^2 d\omega}$$

in which:

$$t_0 = \frac{\int tx(t)^2 dt}{\int x(t)^2 dt}$$

With regard to the derivation of the amplitude parameter, preferably the peak value of the signal is measured, possibly after appropriately filtering it.

A third step (designated by the number 3 in the FIGURE) is a step of separating the set of said measured digital signals into sub-sets, so that the digital signals of each sub-set have similar values of the shape parameter.

In particular, the separation step provides for representing the set of the measured signals (in a single acquisition) as points in a Cartesian reference plane having as co-ordinates said first and second shape parameter. I.e., the measured signals are mapped as points in a T-W plane.

In this way, signals positioned in a same region of said reference plane are grouped in a same sub-set.

Said grouping is preferably obtained with a classifier operating in fuzzy logic on the basis of the assessment of distances of the signals from reference points in said plane. Advantageously, with regard to monitoring, it is possible to define after a first measurement the regions of the T-W plane in which the different sub-sets of signals are situated and to separate the signals automatically.

Following the separation step, to each sub-set are associated values that are representative or of reference for that sub-set. Said parameters must be derived statistically from the set of the impulses available within each sub-set. For example, it is possible to use fractals with high probability of the distribution of the amplitudes to define univocally the intensity of the discharge phenomena within a certain sub-set.

A fourth step (designated with the number 4 in the FIGURE) is a step of correlating the sub-sets relating to different acquisitions, i.e. comprising signals measured in successive steps, whose signals have similar values of the shape parameter.

For example, the sub-sets measured in successive acquisitions are mapped in the T-W reference plane, representing in said plane said values of the reference shape parameters for the related sub-sets; subsequently, a grouping technique of the type used for the separation step is applied.

Therefore, a sub-set of signals measured in the current acquisition is correlated to other sub-sets of signals measured in previous acquisitions and having similar values of the shape parameter. Thus, the correlation step makes available groups of sub-sets of signals measured in different acquisitions but having similar wave forms.

Hence, the separation and correlation steps advantageously enable to analyse mutually signals which are homogeneous relative to the wave form, separately from other signals measured in the same acquisition but having different wave forms, and jointly with the signals measured in previous acquisitions but having similar wave forms.

In this light, it should be kept in mind that the starting assumption is that signals having similar wave forms have the same source; for example, they could derive from the same disturbance or from the same activity of partial discharges in the apparatus.

A fifth step (designated with the number 5 in the FIGURE) is a step of selecting the correlated sub-sets for which the amplitude parameter has a predetermined profile over time, attributing the signals of said sub-sets to partial discharge activities.

Therefore, the selection step advantageously enables to reject the undesired signals and to identify the signals relating to partial discharges in the apparatus.

This constitutes the prerequisite for any diagnostic assessment of the apparatus based on the activity of the partial discharges in the apparatus. To assess the profile over time of the amplitude parameter for the various correlated sub-sets (hence belonging to a group within which all measured signals have similar values of the shape parameter), for example, said values representative of the various sub-sets (derived in the separation step) are considered.

Preferably, the signals of the sub-sets that exhibit a growing profile over time of the amplitude parameter are attributed to partial discharges.

It should also be noted that, after correlating sub-sets of signals measured in acquisitions made at successive times and after selecting a group of sub-sets attributed it to a partial discharge phenomenon, for the successive acquisitions, advantageously, the signals for which the shape parameter has similar values to those of the signals of the selected group are attributed to partial discharge phenomena; in particular, in the selection and attribution phase, in the map T-W an area attributed to partial discharge phenomena (the area in which the values of the shape parameters of the selected group are positioned) is selected, whereupon the signals measured in the successive acquisitions are automatically attributed to partial discharges if, as a function of the corresponding values of the shape parameters, are positioned in the same area of the map T-W.

Moreover, the method thus comprises a step of diagnostically assessing the signals attributed to partial discharge activities (designated with the number 6 in the FIGURE).

Following said diagnostic assessment, the method comprises a decision-making step (designated with the number 7 in the FIGURE) as follows.

If the outcome of said diagnostic assessment is positive, i.e. a low probability is associated to a failure of the apparatus, the method for monitoring the apparatus is continued, by waiting for a time interval (designated with the number 8 in the FIGURE) and the steps described above are subsequently repeated.

Otherwise, if the outcome of the diagnostic assessment is negative, i.e. a high probability is associated to a failure of the apparatus, an inspection or repair intervention is conducted on the apparatus or at least a maintenance intervention on the apparatus is planned (said intervention is designated with the number 9 in the FIGURE).

With regard to the diagnostic assessment step, the signals of a same subgroup (after attributing them to partial discharge activities) are also assessed, mapping the signals in a Cartesian plane in which the times elapsed between successive signals are in the x-axis and the difference of the values of the amplitude parameter for the same signals are in the y-axis.

Alternatively, other known assessment techniques are adopted on the partial discharge signals measured in a same acquisition (preferably, the last one in chronological order).

For example, statistical assessments are made on the time sequence with which the signals of a sub-set were measured, either on histograms or on other charts based on the amplitude parameter and on the time sequence of measurement of said signals.

Moreover, with regard to the diagnostic assessment step, the profile over time of the amplitude parameter for a group of correlated sub-sets is analysed (after attributing them to partial discharge activities).

For example, said profile is compared to a reference profile; or, the increase of the amplitude parameter as a function of time and/or the correlation with meteorological quantities, for example, relative humidity and air temperature, the level of precipitation, is assessed, or the correlation with quantities linked to the operation of the apparatus (voltage, current, temperature measured in different points of the apparatus) is assessed.

The present invention also makes available a device for monitoring an activity of partial electrical discharges in an electrical apparatus powered with direct voltage (DC).

Said device comprises:
  one or more sensors operatively coupled to the apparatus and able to detect current impulses associated to partial electrical discharges taking place in the apparatus;
  an acquisition unit connected to said sensor to measure analogue electrical signals detected by the sensors and to generate corresponding digital signals representative of the wave form of said analogue signals;
  a digital processing unit connected to the acquisition unit to receive said digital signals.

In turn, the processing unit comprises:
  a module for deriving, for each of said digital signals, at least one shape parameter correlated to the wave form of that signal and at least one amplitude parameter correlated to the amplitude of that signal;
  a module for separating the set of said measured digital signals into sub-sets, so that the digital signals of each sub-set have similar values of the shape parameter;
  a module for correlating the sub-sets of signals having similar values of the shape parameter and measured in successive steps;
  a module for selecting the sub-sets for which the amplitude parameters has a predetermined profile over time and attributing the signals of said sub-sets to partial discharge activities.

Preferably, this predetermined profile of the amplitude parameter for the correlated subgroups is a profile that increases over time.

The sensor and the acquisition are of a substantially known type within the field of the detection of partial electrical discharges in AC.

The digital processing unit can be implemented in a dedicated electronic board or in a PLC.

Therefore, the present invention advantageously enables to monitor a partial discharge activity taking place in an electric apparatus operating in DC.

Said monitoring can advantageously be performed during the operation of the apparatus, in operating conditions.

The present invention enables to identify the signals relating to partial discharges, separating them from those relating to disturbances or to other irrelevant phenomena for the diagnostic assessment of the electric apparatus.

In this way, the method in question enables to keep under control the partial discharge activities in an apparatus in DC and to assess their dangerousness in reliable fashion, without having said assessment misled by the superposition of undesired signals to the signals of the partial discharges, this enabling effectively to plan a maintenance strategy or to initiate urgent interventions, when necessary.

The invention claimed is:

1. A method for monitoring an activity of partial electrical discharges in an electrical apparatus powered with direct voltage, characterised in that it comprises the following steps, repeated in succession at predetermined time intervals:

measuring (1), with a sequence of acquisitions repeated over time, analogue electrical signals detected by a sensor operatively coupled to the apparatus and generating corresponding digital signals representative of the wave forms of said analogue signals, thus providing a plurality of data sets acquired through the same sensor at successive steps separated by said predetermined time intervals;

deriving (2), for each of said digital signals, at least one shape parameter correlated to the wave form of that signal and at least one amplitude parameter correlated to the amplitude of that signal, wherein, for each of said digital signals, a first shape parameter, correlated to the time duration of the signal, and a second shape parameter, correlated to the frequency content of the signal, are derived;

separating (3) a set formed by said measured digital signals into sub-sets, so that the digital signals of each sub-set have similar values of the shape parameter, wherein signals positioned in a same region of a reference plane having said first and second shape parameter as co-ordinates are grouped in a same sub-set;

correlating (4) the sub-sets of signals having similar values of the shape parameter and measured in successive steps at said predetermined time intervals, defining correlated groups of sub-sets, thus making available groups of sub-sets of signals measured in different acquisitions but having similar wave forms, wherein said correlated sub-sets belong to corresponding data sets separated by said predetermined time intervals;

selecting (5) any correlated groups of sub-sets having similar values of the shape parameter for which the amplitude parameter has a predetermined profile exhibiting an increase over time and attributing the signals of said sub-sets to partial discharge activities, wherein the correlated sub-sets for which the amplitude parameter has an increasing profile over time are attributed to partial discharge activities, wherein the trend of the amplitude parameter as a function of time is assessed.

2. Method as claimed in claim 1, comprising a step of diagnostically assessing (6) the signals attributed to partial discharge activities, a continuation of the method for monitoring the apparatus or, alternatively, a maintenance intervention on the apparatus itself being provided as a function of the outcome of said diagnostic assessment.

3. A method as claimed in claim 2, wherein the diagnostic assessment step (6) provides, for assessing the signals of a same subgroup attributed to partial discharge activities, mapping the signals in a Cartesian plane in which the times elapsed between successive signals are in the x-axis and the difference of the values of the amplitude parameter for the same signals are in the y-axis.

4. Method as claimed in claim 2, wherein the diagnostic assessment step (6) provides for comparing the profile of the amplitude parameter over time for a group of correlated sub-sets attributed to partial discharge activities to a reference profile.

5. A device for monitoring an activity of partial electrical discharges in an electric apparatus powered with direct voltage, characterised in that it comprises, in combination:

an acquisition unit connected to one or more sensors operatively coupled to the apparatus to measure analogue electrical signals detected by the sensors and to generate corresponding digital signals representative of the wave form of said analogue signals, for providing a plurality of data sets acquired through the same sensor at successive steps separated by predetermined time intervals;

a digital processing unit connected to the acquisition unit to receive said digital signals and having a module for deriving, for each of said digital signals, at least two shape parameters correlated to the wave form of that signal, a first shape parameter, correlated to the time duration of the signal, and a second shape parameter, correlated to the frequency content of the signal, and at least one amplitude parameter correlated to the amplitude of that signal, a module for separating a set formed by said measured digital signals into sub-sets of signals having similar values of the shape parameter and measured in successive steps, by grouped in a same sub-set signals positioned in a same region of a reference plane having said first and second shape parameter as co-ordinates are, and a module for selecting the correlated sub-sets having similar values of the shape parameter for which the amplitude parameter has a predetermined profile exhibiting an increase over time and attributing the signals of said sub-sets to partial discharge activities, assessing the trend of the amplitude parameter as a function of time.

* * * * *